(12) United States Patent
Agostini et al.

(10) Patent No.: US 9,389,022 B2
(45) Date of Patent: Jul. 12, 2016

(54) HEAT EXCHANGER FOR COOLING AN ELECTRONIC COMPONENT

(75) Inventors: Bruno Agostini, Dietikon (CH); Matteo Fabbri, Adliswil (CH)

(73) Assignee: ABB Research Ltd., Zurich (CH)

( * ) Notice: Subject to any disclaimer, the term of this patent is extended or adjusted under 35 U.S.C. 154(b) by 698 days.

(21) Appl. No.: 13/269,104

(22) Filed: Oct. 7, 2011

(65) Prior Publication Data

US 2012/0097369 A1    Apr. 26, 2012

(30) Foreign Application Priority Data

Oct. 20, 2010  (EP) ..................................... 10188165

(51) Int. Cl.
| | |
|---|---|
| F28D 15/00 | (2006.01) |
| F28F 9/02 | (2006.01) |
| F28D 1/00 | (2006.01) |
| F28F 7/00 | (2006.01) |
| F28D 15/02 | (2006.01) |
| F28D 1/053 | (2006.01) |
| H01L 23/427 | (2006.01) |

(52) U.S. Cl.
CPC ........ F28D 15/0233 (2013.01); F28D 1/05391 (2013.01); F28D 15/0266 (2013.01); F28F 9/0278 (2013.01); H01L 23/427 (2013.01)

(58) Field of Classification Search
CPC ........ F28D 15/04; F28D 15/02; H01L 23/427
USPC .................... 165/104.21, 174, 175, 148, 80.2
See application file for complete search history.

(56) References Cited

U.S. PATENT DOCUMENTS

| | | | | |
|---|---|---|---|---|
| 5,295,532 A * | 3/1994 | Hughes | ........................... | 165/76 |
| 5,479,985 A * | 1/1996 | Yamamoto et al. | ........... | 165/176 |
| 6,272,881 B1 * | 8/2001 | Kuroyanagi et al. | ........... | 62/525 |
| 6,742,575 B2 * | 6/2004 | Suzuki | ..................... | 165/104.21 |
| 7,637,314 B2 * | 12/2009 | Park et al. | ..................... | 165/174 |
| 2003/0037910 A1 | 2/2003 | Smyrnov | | |
| 2005/0006073 A1 | 1/2005 | Demuth et al. | | |
| 2005/0039901 A1 | 2/2005 | Demuth et al. | | |

(Continued)

FOREIGN PATENT DOCUMENTS

| | | |
|---|---|---|
| EP | 2 031 332 A1 | 3/2009 |
| EP | 2 327 947 A1 | 6/2011 |

(Continued)

OTHER PUBLICATIONS

Translation of Japanese Document JP200420093A named TRANS-JP200420093A.*

(Continued)

*Primary Examiner* — M. Alexandra Elve
*Assistant Examiner* — Paul Alvare
(74) *Attorney, Agent, or Firm* — Taft Stettinius & Hollister LLP

(57) ABSTRACT

A heat exchanger which can include at least a first group and a second group of channels arranged to provide fluid paths between a first end and a second end of the heat exchanger. Connecting parts are arranged at the first end and at the second end of the heat exchanger. A first heat transfer element transfers a heat load to fluid, and a second heat transfer element transfers a heat load from the fluid. The channels have capillary dimensions. The connecting parts include fluid distribution elements, and the first and second heat transfer element contact all channels.

5 Claims, 3 Drawing Sheets

(56) References Cited

U.S. PATENT DOCUMENTS

| | | | |
|---|---|---|---|
| 2005/0103486 A1* | 5/2005 | Demuth et al. | 165/174 |
| 2009/0056916 A1* | 3/2009 | Yesin et al. | 165/104.21 |
| 2009/0101308 A1* | 4/2009 | Hardesty | 165/80.4 |
| 2009/0126920 A1* | 5/2009 | Demuth et al. | 165/173 |

FOREIGN PATENT DOCUMENTS

| | | |
|---|---|---|
| FR | 2 407 445 A1 | 5/1979 |
| GB | 2 006 950 A | 5/1979 |
| JP | 2004020093 A * | 1/2004 |
| WO | WO 03/054467 A1 | 7/2003 |
| WO | WO 2010/055542 A2 | 5/2010 |

OTHER PUBLICATIONS

European Search Report issued on Mar. 24, 2011.
Office Action issued Sep. 23, 2015 by the European Patent Office in corresponding European Patent Application No. 10 188 165.4.

* cited by examiner

HEAT EXCHANGER FOR COOLING AN ELECTRONIC COMPONENT

RELATED APPLICATIONS

This application claims priority under 35 U.S.C. §119 to European Patent Application No. 10188165.4 filed in Europe on Oct. 20, 2010, the entire content of which is hereby incorporated by reference in its entirety.

FIELD

This disclosure relates to a heat exchanger, for example, to a heat exchanger suitable for use in cooling electronic apparatuses.

BACKGROUND INFORMATION

EP-A-20 31 332 discloses a heat exchanger with evaporator channels and condenser channels extending between opposite first and second ends of the heat exchanger. The opposite ends of the heat exchanger are each provided with connecting parts that provide fluid paths between the evaporator channels and the condenser channels. A first heat transfer element is arranged in a vicinity of the first end of the heat exchanger for transferring a heat load to a fluid in the evaporator channels. Similarly, a second heat transfer element is arranged in a vicinity of the second end of the heat exchanger for transferring a heat load from a fluid in the condenser channels to surroundings.

The above described heat exchanger can be efficient in cooling down, for example, power electronics attached to the first heat transfer element. Due to a construction of thermosyphon type, cooling can be achieved without a need for a pumping unit.

The heat exchanger is to be installed in a specific position in order to work properly. Such a restriction can preclude implementations where it would be advantageous to install the heat exchanger in an upside down or horizontal position.

SUMMARY

A heat exchanger is disclosed including a first group of channels and a second group of channels, each arranged to provide fluid paths between a first end and a second end of the heat exchanger, the channels of the first and second groups of channels having capillary dimensions. The first connecting parts are arranged at the first end, and the second connecting parts are arranged at the second end of the heat exchanger; wherein the first connecting parts include a first fluid distribution element arranged to conduct fluid from one or more channels of the first group of channels into one or more channels of the second group of channels, the second connecting parts include a second fluid distribution element arranged to conduct fluid from one or more channels of the first group of channels into one or more channels of the second group of channels, a first heat transfer element arranged in a vicinity of the first end for transferring a heat load to fluid in the first and second groups of channels, the first heat transfer element being arranged to transfer the heat load to fluid in all channels of the at least first and second groups of channels; and a second heat transfer element arranged in a vicinity of the second end for transferring a heat load from fluid in the first and second groups of channels, the second heat transfer element being arranged to transfer the heat load away from fluid in all channels of the at least first and second groups of channels.

A heat exchanger is disclosed including means for providing fluid paths between a first end and a second end of the heat exchanger; means for conducting fluid from one or more channels of the first group of channels into one or more channels of the second group of channels; means arranged in a vicinity of the first end for transferring a heat load to fluid in all of the fluid paths; and means arranged in a vicinity of the second end for transferring a heat load from fluid in all of the fluid paths.

BRIEF DESCRIPTION OF THE DRAWINGS

In the following, the present disclosure will be described in greater detail by way of example and with reference to the attached drawings, in which.

DETAILED DESCRIPTION

The present disclosure can provide an efficient and relatively inexpensive heat exchanger which can be less sensitive regarding the position in which the heat exchanger is installed.

The heat exchanger according to an exemplary embodiment of the disclosure, includes at least a first and second group of channels having capillary dimensions, and fluid distribution elements at opposite ends of the heat exchanger. First and second heat transfer elements are in contact with all the channels of the first and second group of channels in order to transfer heat load to fluid in the channels and, respectively, from the fluid in the channels. This enables the heat exchanger to work as a Pulsating Heat Pipe (PHP). By using channels having capillary dimensions, oscillations can occur in a small channel loop heat pipe due to the bidirectional expansion of vapour inside the channels. Consequently, the heat exchanger can work in any orientation, without significant additional costs, and with a fluid volume that is relatively smaller.

Figure 1:
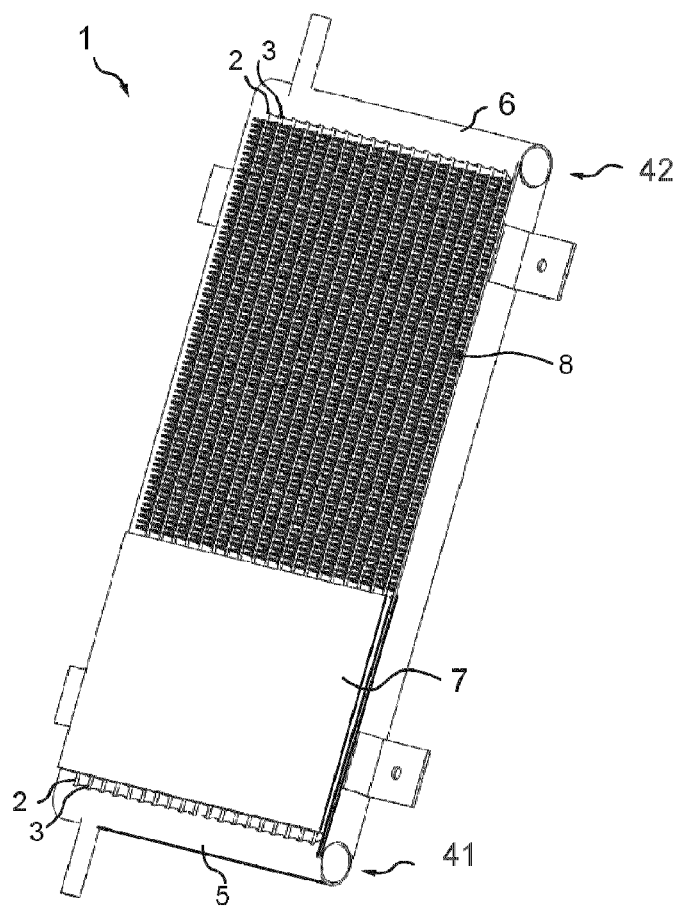
FIG. 1 illustrates an exemplary embodiment of a heat exchanger.

FIG. 1 illustrates an exemplary embodiment of a heat exchanger 1. The heat exchanger 1 includes at least a first group of channels 2 and a second group of channels 3 extending between a first end 41 and a second end 42 of the heat exchanger 1. A first connecting part 5 is arranged at a first end 41 of the heat exchanger 1 for providing a fluid path between channels of the first group of channels 2 and the second group of channels 3, as will be explained later. A second connecting part 6 is arranged at a second end 42 of the heat exchanger 1.

In an exemplary embodiment there can be more than two groups of channels. These channels have capillary dimensions. In this context "capillary dimensions" can refer to channels that are capillary-sized, in which case they have a size small enough so that bubbles can grow uniquely in a longitudinal direction (for example, in a longitudinal direction of the channel as opposed to a radial direction of the channel) and thereby create a pulsating effect by pushing the fluid.

The heat exchanger also includes a first heat transfer element 7 arranged in a vicinity of the first end 41 of the heat exchanger 1, for transferring a heat load to a fluid in the channels of the first group of channels 2 and second group of channels 3. The heat exchanger of FIG. 1 can be used in an electronics apparatus, for example, a frequency converter, for conducting heat away from components generating a heat load. In that case, electronic circuits can be attached to the first heat transfer element 7. The heat transfer element 7 transfers the heat load to fluid in all channels of the first group of channels 2 and the second group of channels 3. The first heat transfer element 7 is in contact with each of the channels.

The heat exchanger 1 also includes a second heat transfer element 8, which in an exemplary embodiment, can include fins extending between walls of channels of the first 2 and second 3 group of channels in order to transfer heat from fluid inside the heat exchanger 1 to, for example, ambient surroundings. In this way the heat load can be transferred from fluid in all channels to the fins and further from the fins to the air surrounding the second heat transfer element 8.

Figure 2:
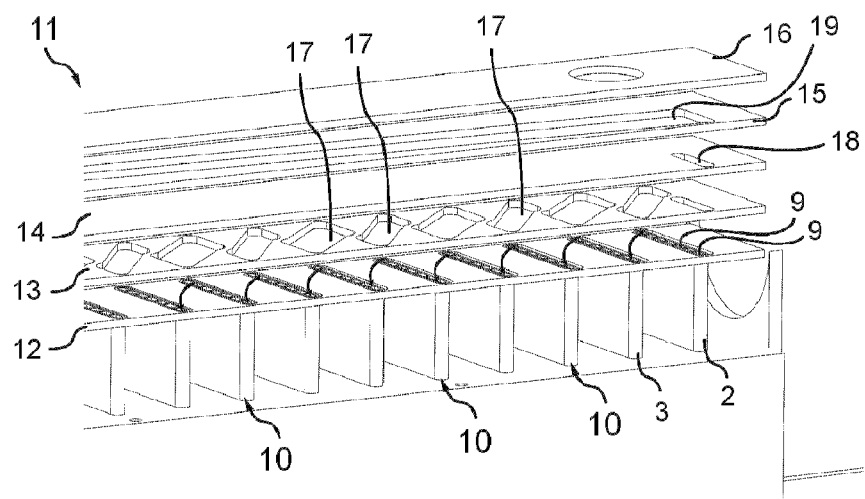
FIG. 2 illustrates an exemplary embodiment of a first fluid distribution element.

FIG. 2 illustrates a first fluid distribution element 11. The first fluid distribution element 11 of FIG. 2 may be utilized inside the first connecting part 5 of the heat exchanger 1 shown in FIG. 1, for example.

The channels 9 extending between the first and second ends of the heat exchanger 1 are grouped together into at least a first group of channels 2 and a second group of channels 3, each group including a plurality of channels 9. In an exemplary embodiment, the heat exchanger 1 can include a plurality of parallel pipes 10 extending between the first end 41 and the second end 42 of the heat exchanger 1. These pipes 10 are divided into channels 9 by internal walls of the pipes 10. Thus, each pipe 10 contains channels 9 of one group of channels. The pipes 10 or tubes may be MPE (MultiPort Extruded) pipes, for example.

The channels 9 have capillary dimensions. In an exemplary embodiment they are capillary-sized so that no additional capillary structures are needed on their internal walls. The diameter of a channel or tube which is considered capillary depends on the fluid that is used (boiling) inside. The following formula, for instance, can be used to evaluate a suitable diameter:

$$D = (sigma/(g*(rhol-rhov)))^{0.5},$$

wherein sigma is the surface tension, g the acceleration of gravity, rhov the vapour density and rhol the liquid density. This formula gives values from 1 to 3 mm for R134a (Tetrafluoroethane), R145fa and R1234ze (Tetrafluoropropene), which are fluids, for example, suitable for use in the heat exchanger illustrated in the figures. The length of the illustrated heat exchanger can be from about (e.g., ±10%) 20 cm to 2 m or more or less.

The first fluid distribution element 11 is arranged to conduct fluid from one or more predetermined channels 9 of the first group of channels 2 into one or more predetermined channels 9 of the second group of channels 3. In an exemplary embodiment, the first fluid distribution element 11 has been implemented by a plurality of plates 12 to 15, at least some of the plates include openings for providing fluid paths between channels 9 of the groups of channels.

The lowest plate 12 can be provided with openings that tightly surround the pipes 10. The following plate 13 is arranged on top of the lowest plate 12, and can be provided with openings 17 which allow fluid to pass from predetermined channels of the first group 2 of channels to predetermined channels of the second group 3 of channels, as indicated by arrows in FIG. 2. As FIG. 2 illustrates an example with more than two groups of channels, the openings 17 allow fluid to pass from predetermined channels of a group to predetermined channels of an adjacent group for all illustrated groups. Flow is possible only to or from such channels 9 whose openings are located at the openings 17 of the plate 13. Flow to or from other channels 9 is blocked by the lower surface of plate 13.

The third plate 14 can be arranged as a lid on top of the plate 13 in order to ensure that a flow of fluid takes place only where the openings 17 of the plate 13 are located. However, the third plate 14 can also includes two holes 18 (in this example) located at the outermost pipes 10 of the heat exchanger. In FIG. 2 only one of the holes 18 is shown. In this way the third plate 14, in cooperation with the hole 19 in the fourth plate 15, can define a channel, which makes it possible for fluid to flow from one or more predetermined channels of the pipe located outermost to the left to one or more predetermined channels of the pipe located outermost to the right, and vice versa. The presence of such a channel can cause the heat exchanger to behave like a closed loop pulsating heat pipe.

Finally the uppermost plate 16 can be arranged as a lid on top of the fourth plate 15 and can prevent leakage from the channel defined by the opening 19. In an exemplary embodiment, though not necessarily in all embodiments, the uppermost plate 16 can be provided with an opening that can be connected to a pipe and a valve for the purpose of filling or emptying the heat exchanger when necessary. In addition this opening can be used for pressure and/or temperature measurements, for example.

In an exemplary embodiment, plates 14 and 15 can be removed from FIG. 2. In that case, no flow path exists between the channels of the leftmost and rightmost pipes 10. Consequently, the heat exchanger can work as an open loop pulsating heat pipe.

Figure 3:
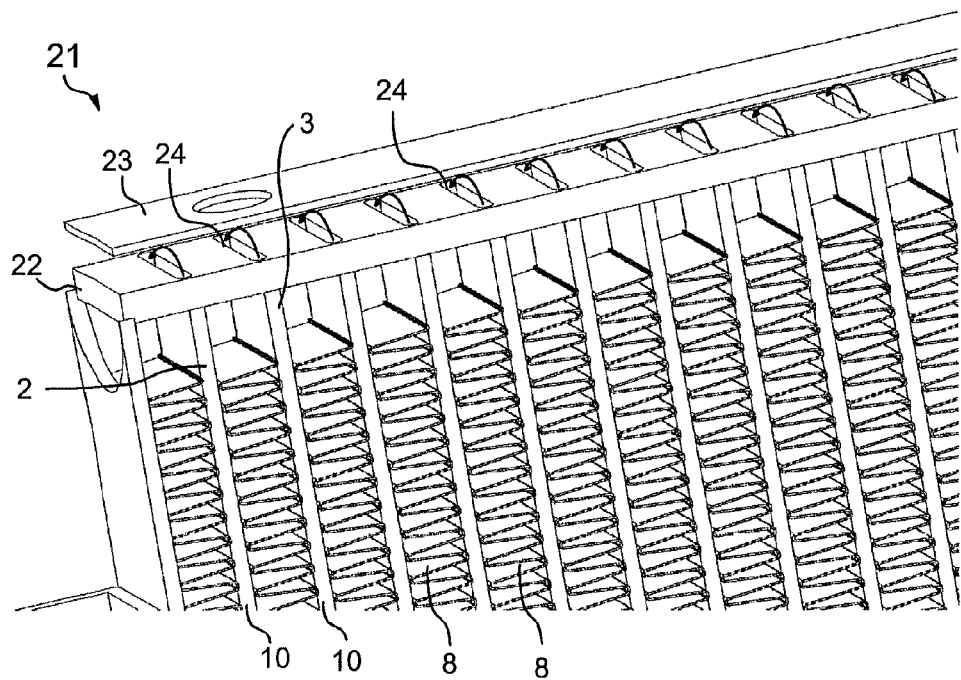
FIG. 3 illustrates an exemplary embodiment of a second fluid distribution element.

FIG. 3 illustrates a second fluid distribution element. The second fluid distribution element 21 of FIG. 3 may be utilized inside the second connecting part 6 of the heat exchanger 1 shown FIG. 1, for example.

The second fluid distribution element 21 conducts fluids between channels 9 that belong to the same group, as indicated by arrows in FIG. 3. Consequently, the second fluid distribution element 21 conducts fluid from one or more channels 9 of the first group 2 into one or more channels 9 of the same first group 2.

In an exemplary embodiment, the second fluid distribution element 21 can be implemented with two plates 22 and 23, for example. The first plate 22 can be provided with openings 24 which tightly surround the pipes 10 containing the groups 2, 3 of channels and which provide fluid paths between channels 9 within each group of channels. Plate 23 can be arranged on top of plate 22 as a lid. In an exemplary embodiment, though not necessarily in all embodiments, plate 23 can be provided with an opening that can be connected to a pipe and a valve for the purpose of filling or emptying the heat exchanger when necessary. In addition, this opening can be used for pressure and/or temperature measurements, for example.

FIG. 3 also illustrates the second heat transfer element 8, which for example, can include fins extending between walls of the pipes 10. The fins have been dimensioned to contact the pipes 10 along their entire side surfaces. Consequently, the second heat transfer element 8 can be arranged to transfer heat load from fluid in all channels 9 of the groups of channels contained in pipes 10.

Figure 4:
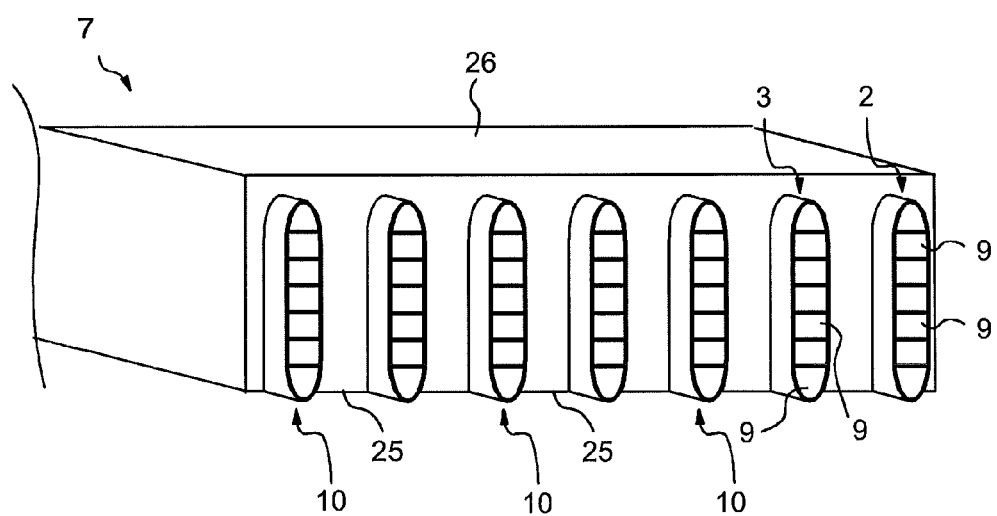
FIG. 4 illustrates an exemplary embodiment of a first heat transfer element.

FIG. 4 illustrates a first heat transfer element 7. This first heat transfer element 7 can be utilized in the heat exchanger of FIG. 1.

The heat transfer element 7 can include a block of a material with good heat conductivity. Suitable materials include, for example, metals, such as aluminum. The same material or another material with good heat conductivity can be used for the pipes. In FIG. 4, the upper flat surface 26 can be utilized for attaching electronic components that require efficient cooling, for example. The lower surface 25 can be provided with grooves into which tubes 10 have been arranged. Each tube contains channels 9 of one group of channels, such as channels 9 of the first 2 or second 3 group of channels. The grooves are deep enough for the first heat transfer element 7 to contact the entire side walls of the tubes 10. Therefore, the first heat transfer element 7 receives a heat load from all the channels 9 included in the illustrated groups of channels.

Figure 5:
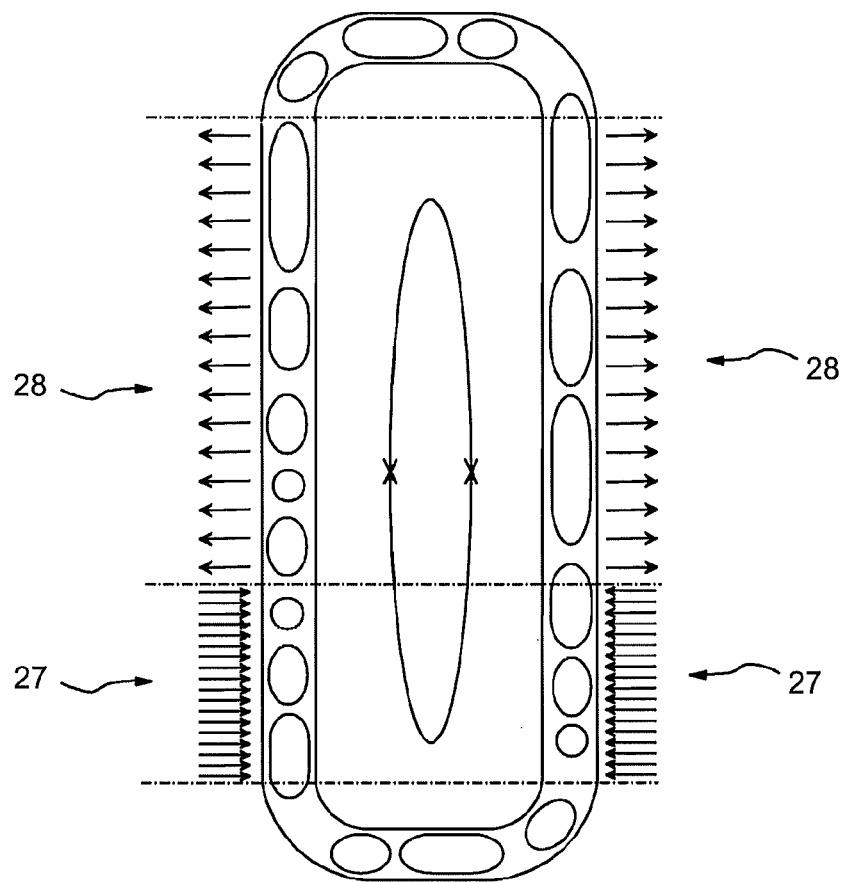
FIG. 5 illustrates the function of the heat exchanger.

FIG. 5 illustrates the function of the heat exchanger constructed according to FIGS. 1 to 4.

The heat exchanger 1 has a construction resembling the construction of a Compact Thermosyphon Heat Exchanger (COTHEX). However, the channels have capillary dimensions and the connecting parts of the first and the second end are provided with fluid distribution elements that conduct fluid from predetermined channels between the different groups of channels. This makes it possible to have the heat exchanger work as a Pulsating Heat Pipe (PHP). In such a solution, oscillations occur in a small channel loop heat pipe due to the bidirectional expansion of vapour inside the channels. During operation, the liquid slugs and elongated vapour bubbles will oscillate between a cold and a hot region because of hydrodynamic instabilities caused by the rapid expansion of the bubbles confined in the small channels, and thus provide a fluid velocity almost independent of gravity. Consequently, the heat exchanger illustrated in the figures can work in any orientation although there can be performance changes depending on the orientation. There is no preferred flow direction due to the occurrence of the periodic oscillations and, therefore, no need for a riser and a downcomer.

In FIG. 5, the lower part 27 of the heat exchanger, where the first heat transfer element is located, works as an evaporator receiving a heat load and transferring it into fluid in channels of the heat exchanger. The upper part 28 of the heat exchanger, where the second heat transfer element is located, works as a condenser transferring heat load from fluid in the channels of the heat exchanger to the surroundings. However, it should be observed that "lower" and "upper" in this context only refers to the position of the heat exchanger as shown in FIG. 5 by way of example. The heat exchanger can also be used in an upside-down position as compared with the example illustrated in FIG. 5. No pump is needed in order to transfer fluid within the heat exchanger, as the heat exchanger works as a pulsating heat pipe. In addition, no separate condenser pipes, evaporator pipes, risers or down-corners to/from the condenser or the evaporator is needed. Consequently, the fluid volume is relatively small even though an efficient cooling can still be achieved.

Figure 6:
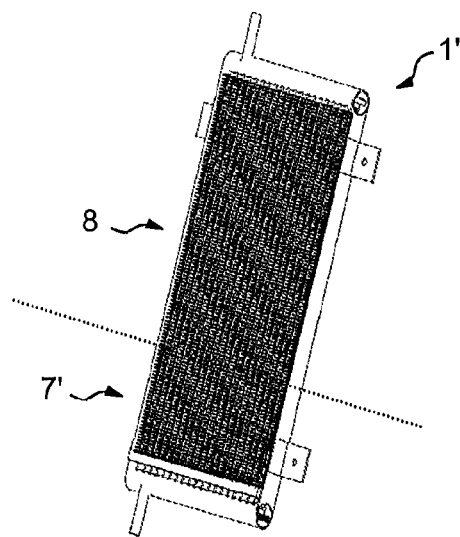
FIG. 6 illustrates an exemplary embodiment of a heat exchanger.

FIG. 6 illustrates an exemplary embodiment of a heat exchanger 1'. The heat exchanger of FIG. 6 is similar to the one illustrated in FIG. 1. Therefore the embodiment of FIG. 6 will be explained by referring to the differences between these embodiments.

In FIG. 1, the first heat transfer element 7 is presented as a plate where electronic circuits can be attached. In that way heat can be conducted from the plate to the channels containing fluid. In FIG. 6, however, the first heat transfer element 7' includes fins extending between walls of the channels. Therefore, heat from the surroundings of the first heat transfer element 7' can be transferred via the fins to the fluid in the channels. A hot airstream can be generated to pass via the fins of the first heat transfer element 7' in order to obtain a sufficient heat transfer, if desired. A similar cold airstream can also be utilized in order to transfer heat away from the second heat transfer element 8 in this embodiment as well as in other embodiments.

The fins of the first heat transfer element 7' and of the second heat transfer element 8 can be shaped and arranged in an identical way, for example, as illustrated in FIG. 3, such that the fins contact the entire side walls of the pipes 10 containing the groups of channels 9.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A heat exchanger, comprising:
a first group of channels, a second group of channels and a plurality of following groups of channels, each arranged to provide fluid paths between a first end and a second end of the heat exchanger and each channel of the groups of channels having capillary dimensions;
pipes extending between the first end of the heat exchanger and the second end of the heat exchanger, each pipe is divided by internal walls into the channels such that each pipe contains channels of one of said groups of channels only, two of said pipes being outermost in a direction transverse the extension of the pipes from the first end to the second end and one containing the first group of channels;
first connecting parts arranged at the first end, and second connecting parts arranged at the second end of the heat exchanger; wherein the first connecting parts include a first fluid distribution element implemented as a plurality of plates arranged on top of each other, a first plate of the plurality of plates including a first opening arranged to conduct fluid from one or more channels of the first group of channels only into one or more channels of the second group of channels and second openings arranged to conduct fluid only to one or more channels of each following group of channels;
the second connecting parts include a second fluid distribution element implemented as a plurality of plates arranged on top of each other, a first plate of the plurality of plates including openings arranged to conduct fluid from one or more channels of any group of channels only into one or more channels of the same group of channels;
a first heat transfer element arranged in a vicinity of the first end, the first heat transfer element has a first surface for receiving electronic components and a second surface with grooves into which the groups of channels are arranged such that the first heat transfer element contacts walls of all the channels in at least the first and second group of channels for transferring a heat load generated by the electronic components to fluid in all channels of the at least first and second groups of channels;
a second heat transfer element arranged in a vicinity of the second end for transferring a heat load from fluid in the groups of channels, the second heat transfer element being arranged to transfer the heat load away from fluid in all channels of at least the first and second groups of channels;
said plurality of plates in the first fluid distribution element comprises a second and third plate with openings forming a channel which provides a fluid path only between one or more predetermined channels of the first group of channels located in one of the pipes which is outermost and one or more predetermined channels of a group of channels located in the other pipe which is outermost.

2. The heat exchanger according to claim 1, wherein the first group of channels, and the second group of channels, respectively consists of channels separated by internal walls of a respective pipe.

3. The heat exchanger according to claim 1, wherein the second heat transfer element comprises:
fins extending between walls of the channels in order to transfer heat from fluid in the channels to the surroundings via the fins.

4. The heat exchanger according to claim 1, comprising:
an electronic component arranged on the first surface of the first heat transfer element.

5. The heat exchanger according to claim 4, wherein the electronic component is attached to the first surface of the first heat transfer element.

* * * * *